United States Patent
Park et al.

(10) Patent No.: US 7,560,764 B2
(45) Date of Patent: Jul. 14, 2009

(54) SONOS MEMORY DEVICE HAVING CURVED SURFACE AND METHOD FOR FABRICATING THE SAME

(75) Inventors: Byung-Gook Park, Seoul (KR);
Jung-Hoon Lee, Gyeonggi-do (KR)

(73) Assignees: Seoul National University Foundation, Seoul (KR); Samsung Electronics Co., Ltd., Suwon-si (KR)

( * ) Notice: Subject to any disclaimer, the term of this patent is extended or adjusted under 35 U.S.C. 154(b) by 434 days.

(21) Appl. No.: 11/424,524

(22) Filed: Jun. 15, 2006

(65) Prior Publication Data
US 2006/0284245 A1 Dec. 21, 2006

(30) Foreign Application Priority Data
Jun. 18, 2005 (KR) .................. 10-2005-0052757

(51) Int. Cl.
*H01L 23/62* (2006.01)
(52) U.S. Cl. .............. 257/315; 257/301; 257/317; 257/E21.209; 257/E21.422; 257/E21.682
(58) Field of Classification Search ................ 257/301, 257/315, 317, E21.209, E21.422, E21.682
See application file for complete search history.

(56) References Cited
U.S. PATENT DOCUMENTS
6,548,861 B2 4/2003 Palm et al.
6,794,249 B2 9/2004 Palm et al.

7,250,651 B2 * 7/2007 Kusters et al. .............. 257/315
2006/0038220 A1 * 2/2006 Kusters et al. .............. 257/315
2008/0157172 A1 * 7/2008 Lee ............................ 257/321

FOREIGN PATENT DOCUMENTS
KR 1020030020644 3/2003

OTHER PUBLICATIONS

H. Reisinger, et al. "A Novel SONOS Structure for Nonvolatile Memories with Improved Data Retention" 1997 Symposium on VLSI Technology Digest of Technical Papers, pp. 113-114.
Changhyun, Lee, et al. "A Novel Structure of $SiO_2$/SiN/High k Dielectrics, $Al_2O_3$ for SONOS Type Flash Memory" Int'l Conf. Solid State Dev. Materials, 2002, pp. 162-163.
Chang Hyun Lee, et al "A Novel SONOS STtructure of $SiO_2$/SiN/$Al_2O_3$ with TaN Metal Gate for Multi-giga Bit Flash Memories" Int'l Electron Dev. Meet., 2003, pp. 613-616.

* cited by examiner

*Primary Examiner*—Fernando L Toledo
(74) *Attorney, Agent, or Firm*—Marger Johnson & McCollom PC

(57) ABSTRACT

A new SONOS memory device is provided, in which a conventional planar surface of multi-dielectric layers (ONO layers) is instead formed with a curved surface such as a cylindrical shape, and included is a method for fabricating the same.

A radius of curvature of the upper surface of a blocking oxide can be designed to be larger than that of the lower surface of a tunneling oxide, which restrains electrons from passing through the blocking oxide by back-tunneling on erasing. As a result, a SONOS memory device shows an improvement in erasing speed.

6 Claims, 13 Drawing Sheets

SONOS MEMORY DEVICE HAVING CURVED SURFACE AND METHOD FOR FABRICATING THE SAME

CROSS-REFERENCE TO RELATED APPLICATION

This application claims priority under 35 U.S.C. § 119 of Korean Patent Application 2005-0052757, filed on Jun. 18, 2005, the entire contents of which are hereby incorporated by reference.

BACKGROUND

1. Technical Field

The present invention relates to a SONOS memory device having a curved surface and a method for fabricating the same, and more particularly to a SONOS memory device, of which multi-dielectric layers (for example, ONO layers: Oxide/Nitride/Oxide layers) have a cylindrical surface, and a method for fabricating the same.

2. Description of Related Art

Currently, a SONOS (Silicon-Oxide-Nitride-Oxide-Silicon) memory device has been paid attention to as the next generation of memory device. Especially, a SONOS memory device is considered to be a potent flash memory cell for the next generation because it can take advantage of a large amount of deep level traps, which exist in a nitride layer among multi-dielectric layers.

However, a conventional SONOS memory device has been fabricated in a planar NMOS type, as shown in FIG. 1. It has an energy band diagram like FIG. 2. The average thermal energy of electrons is only 0.025 eV at room temperature (300K). Therefore, to program a SONOS memory device, it is necessary to find special methods for electrons of a substrate 10 to get into a nitride layer 34 of multi-dielectric layers 30 beyond the energy barrier (3.1 eV) of a tunneling oxide 32. One method is CHE (Channel Hot-Electron) injection in which electrons in a channel can be injected by accelerating them to overcome the energy barrier (3.1 eV) of a tunneling oxide 32. The other method is F-N tunneling (Fowler-Nordheim tunneling).

In F-N tunneling, as shown in FIG. 3, an energy band diagram would be changed by applying voltage to both ends of a substrate 10 and a control gate 40 (especially, high voltage to a control gate) which heightens the possibility that electrons from the conduction band ($E_c$) of a substrate will penetrate a tunneling oxide 32, which becomes thin on the energy band diagram, and enter a nitride layer 34.

As shown in Equation 1, a tunneling current J is proportional to a probability $T_t$ that electrons of a conduction band of a substrate will penetrate a barrier, such as a tunneling oxide. $T_t$ is exponentially proportional in inverse to the thickness $x_1$ of the barrier, which electrons of a conduction band ($E_c$) of a substrate see, as shown in Equation 2 $x_1$ is inversely proportional to the electric field ($\in_{OX}$) formed across the barrier (a tunneling oxide) as shown in Equation 3.

$$J = \frac{4\pi qm}{h^3} \int_0^{E_F} dE \int_0^E T_t dE_t \quad <\text{Equation 1}>$$

$$T_t = \exp\left[-2\int_0^{x_1} k_{OX}(x)dx\right] \quad <\text{Equation 2}>$$

where $k_{OX}$ indicates a wave vector of tunneling electrons.

$$\chi_1 = (\Phi_B + E_F - E)/q\in_{OX} \quad <\text{Equation 3}>$$

In F-N tunneling a higher voltage is applied to a control gate compared to a substrate, which changes the energy band as shown in FIG. 3. As the conduction band of the tunneling oxide slants downward, the thickness of a barrier, which electrons of a conduction band of a substrate see, becomes thinner than before. Therefore, the possibility that electrons of a conduction band of a substrate will penetrate a tunneling oxide becomes greater, and it makes quantum mechanic tunneling current flow. As a result, F-N tunneling enables injection of electrons into a nitride layer of multi-dielectric layers for programming.

Meanwhile, electrons injected into a nitride layer of multi-dielectric layers should be emitted or eliminated for erasing a SONOS memory device, and the F-N tunneling has been mainly used for erasing a SONOS memory device. Contrary to that described above for programming, when a lower voltage to a control gate compared to a substrate is applied, it leads an energy band to be changed as shown in FIG. 4. A valence band of tunneling oxide slants upwardly, and finally, the thickness of a barrier, which holes in the valence band (Ev) of a substrate see, becomes thinner than before. Therefore, the possibility that holes of a valence band of a substrate will penetrate a tunneling oxide becomes greater, and it makes quantum mechanic tunneling current flow in the opposite direction as above. As a result, F-N tunneling enables injection of holes into a nitride layer of multi-dielectric layers for erasing.

However, in a conventional planar type SONOS memory device as shown in FIG. 1, F-N tunneling for erasing has the problem that electrons, that penetrated a blocking oxide 36 from a control gate 40 and entered a nitride layer 34 of multi-dielectric layers by back-tunneling, make the speed of an erase operation slower, and recovery of a threshold voltage to the original state ceases at a certain level. Namely, there is the possibility that electrons of a conduction band of polysilicon, a control gate, also will penetrate a thin barrier (blocking oxide) and enter a nitride layer of multi-dielectric layers, and it takes a long time to remove the electrons, and in addition, removing electrons has limits.

Therefore, the incomplete erase problems should be overcome to commercialize a SONOS device as a memory device.

One method to solve the erase problem is hot-hole injection. According to this method, in a NMOS structure as shown in FIG. 5, applying a high negative voltage between a source or a drain and a body with reverse bias brings about a result that a $N^+$ region of a source or a drain under a gate becomes inversed at the surface, and as a result, holes are generated. Then, the electric field is high at the partially formed $N^+$-$P^+$ junction, and band-to-band tunneling can occur. After that, holes escaping toward a channel become more accelerated by a voltage applied between a source or a drain and a body, and among holes, hot holes with enough momentum can be injected easily into a nitride layer with the help of a gate voltage. Despite their heavy mass and the tunneling barrier, such hot holes have much larger energy than F-N tunneled holes do, and therefore, can be injected effectively into a nitride layer.

However, an erase of a memory by hot hole injection should be accompanied by setting a gate voltage and a body voltage as well as by setting a source bias and a drain bias at a predetermined value, respectively. But, there is a problem that such a method cannot be applied in a NAND type flash memory array. When a high negative voltage is applied to a gate for erase by the hot hole injection in a conventional NMOS type memory device, the channel turns off due to an accumulation mode, and a voltage supplied from a bit line cannot be effectively delivered to a source and a drain of each memory device, which are connected with each other in series.

Therefore, in a NAND type flash memory, using both program and erase by F-N tunneling, the erase speed problem by back-tunneling effect has been the main reason to delay the commercialization of a SONOS memory.

Until now, there have been various trials to improve the erase speed problem not by the hot-hole injection but by the F-N tunneling.

Among them, Reisinger et al., used a poly-silicon doped with $P^+$ rather than $N^+$ for a gate of a SONOS memory device, and this raised a tunneling barrier between a gate and a nitride layer to lessen the back-tunneling effect (Dig. Symp. VLSI Tech., 1997, pp. 113-114). But when a high negative voltage is applied to a gate (word line), electrons of a valance band at a gate tunnel to the nitride layer and there are still some limits for improving the erase speed.

Another method to improve the erase speed is to replace a blocking oxide 36 in FIG. 1 with high-k dielectrics (for instance, $Al_2O_3$) to increase the capacitance of a blocking layer (Ext. Abst. Int'l Conf. Solid State Dev. Materials, 2002, pp. 162-163), or to use metal TaN, instead of poly-silicon for a gate of a SONOS memory device (Tech. Dig. Int'l Electron Dev. Meet., 2003, pp. 613-616). But these methods still have problems in that the use of a high-k material or a metal gate severely diminishes the silicon CMOS technology compatibility, and it cannot make the best use of the advantages of a SONOS.

SUMMARY

Accordingly, the present invention is directed to a new SONOS memory device and a method for fabricating the same, and more particularly to a SONOS memory device, in which a conventional planar multi-dielectric layers (ONO layers) is changed with a multi-dielectric layers having a cylindrical curved surface. This makes tunneling through a tunneling oxide easier for programming and limits a blocking oxide from tunneling for erasing, and so it substantially obviates the erase problems of the related art.

The invention is directed to a new SONOS memory device, in which a surface of multi-dielectric layers (ONO layers) is cylindrical, and it is based on the physical law, which the electric field in a cylinder is inversely proportional to the radius of the cylinder. Therefore, when a radius of curvature of a tunneling oxide is made to be different from a radius of curvature of a blocking oxide, it enables easier tunneling of a tunneling oxide for programming and limits a blocking oxide from tunneling for erasing.

The more specific objective of the present invention is as follows: first of all, F-N tunneling current $J_{FN}$ can be obtained from Equations 1, 2 and 3.

$$J_{FN} = A\varepsilon_{OX}^2 \exp\left(-\frac{B}{\varepsilon_{OX}}\right) \qquad <\text{Equation 4}>$$

As shown in Equation 4, $J_{FN}$ is proportional to the electric field ($\varepsilon_{OX}$) across the oxide layer to be tunneled.

Therefore, the objective of the present invention is to increase numbers of tunneling holes through a tunneling oxide, and to decrease numbers of back-tunneling electrons through a blocking oxide by differentiating the electric field at a tunneling oxide from the electric field at a blocking oxide of multi-dielectric layers (ONO layers) for erasing.

It can be readily appreciated that the specific embodiment, in which multi-dielectric layers (ONO layers) are cylindrical, is merely illustrative of the basic principles of the invention, and that various other embodiments may be devised from the spirit and novel principles of the invention. In other words, on erasing, every structure, for example, an oval structure, a triangular structure and so on, which can differentiate the electric field of a multi-dielectric layers (ONO layers) at the tunneling oxide from that at the blocking oxide, is consistent with the objective of the present invention.

Reference number 100 indicates a semiconductor substrate; 120 and 120a indicate an active region; 200 and 200a mean a field region; 300 means multi-dielectric layers (ONO layers); 320, 320a and 320b mean a first oxide layer (tunneling oxide); 340, 340a and 340b mean a nitride layer; 360 means a second oxide layer (blocking oxide); 380 means a hard mask; and 400 means a gate (control gate).

DETAILED DESCRIPTION

To achieve objectives of the present invention, a SONOS memory device, which comprises a semiconductor substrate having an active region and a field region; a gate formed over the active region; multi-dielectric layers formed between the active region and the gate, wherein the multi-dielectric layers are comprised of a first oxide layer, a nitride layer and a second oxide layer sequentially formed on-the active region; and a source region and a drain region formed in the active region under both sides of the gate respectively, wherein the upper surface of the active region is a curved surface, the multi-dielectric layers also have a curved shape according to the upper surface of the active region, and the gate wraps the second oxide layer having the curved shape.

Another aspect of some embodiments is a method for fabricating a SONOS memory device, which comprises a first step of forming a mask for a predetermined active region by depositing an insulating layer on a semiconductor substrate and etching the insulating layer; a second step of forming a fin-shape active region by etching a substrate using the mask, and forming a field region around the active region with an oxide layer; a third step of planarizing the upper part of the active region and the field region, and etching the oxide layer of the field region in order to expose a part of the fin-shape active region; a fourth step of annealing process for making the exposed fin-shape part of the active region cylindrical; and a fifth step of forming multi-dielectric layers (ONO layers) by depositing a first oxide layer, a nitride layer and a second oxide layer sequentially on the cylindrical active region and the field region, and forming a control gate by depositing a gate material on the multi-dielectric layers and etching the gate material.

Figure 6:
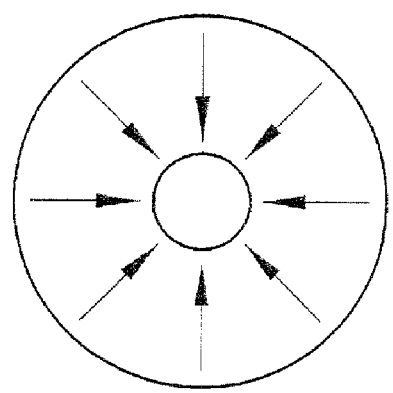
FIG. 6 is a diagram illustrating an electric field line when a voltage is applied between the interior and exterior of a cylindrical capacitor.

A detailed description of preferred embodiments of the present invention is provided with respect to the accompanying drawings as follows:

First, as shown in FIG. 6, when multi-dielectric layers (ONO layers) are cylindrical type, a radius of the interior surface is $r_1$, and a radius of the exterior surface is $r_2$, the electric field at the interior of the cylinder (between $r_1$ and $r_2$) is as follows on the basis of Gauss's law:

$$\frac{Q}{\epsilon} = \oint_s \vec{E} \cdot \vec{ds} \qquad <\text{Equation 5}>$$
$$= 2\pi r l \cdot E$$

From Equation 5, the electric field (E) at the interior of the cylinder is inversely proportional to the radius r.

Therefore, the ratio of the electric field at the interior surface $E_1$ and the electric field at the exterior surface $E_2$ is as follows:

$$E_1:E_2 = r_2:r_1 = r_2/r_1:1$$

Therefore, it can be concluded that the interior electric field is $r_2/r_1$ larger than the exterior electric field.

This is based on the fact that when a voltage is applied to a cylindrical capacitor, the deeper into the interior, the flux gathers, and accordingly, the larger the electric field becomes.

In a conventional semiconductor device, to reduce the corner effect, which is generated at the edges, where the electric field becomes larger, rounding has been used. On the contrary, the present disclosure makes full use of the corner effect, and it makes a radius of curvature of an interior tunneling oxide of multi-dielectric layers (ONO layers) small to get high electric field and a radius of curvature of an exterior blocking oxide large to get relatively low electric field. As a result, on erasing, the back-tunneling effect of electrons can be reduced.

Figure 11A:
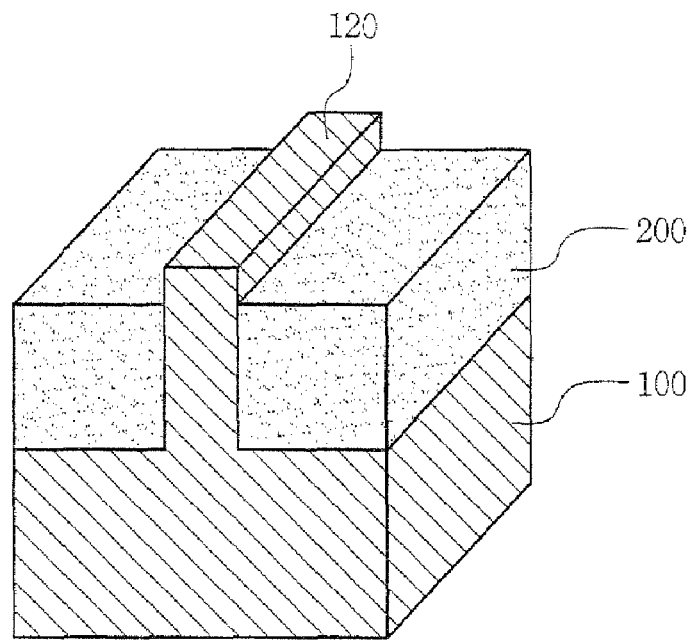
FIGS. 11a to 15b are exploded perspective views illustrating processes for fabricating a SONOS device according to some embodiments.
Figure 11B:
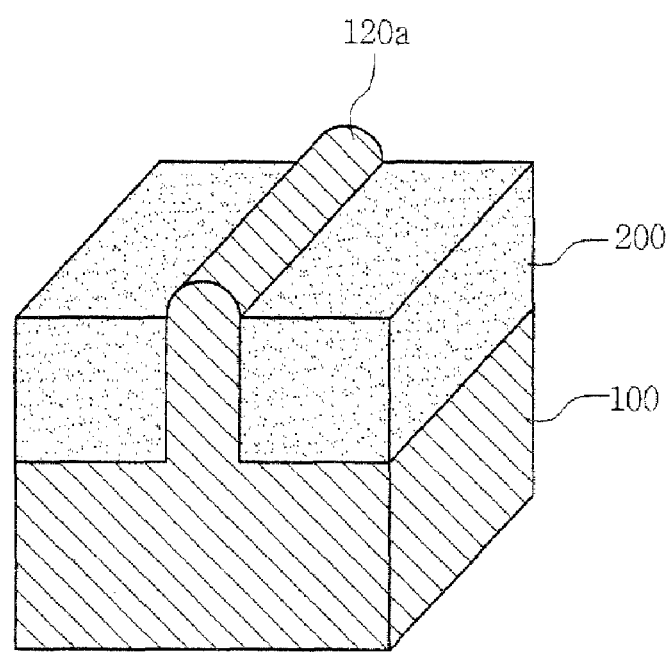
Figure 11C:
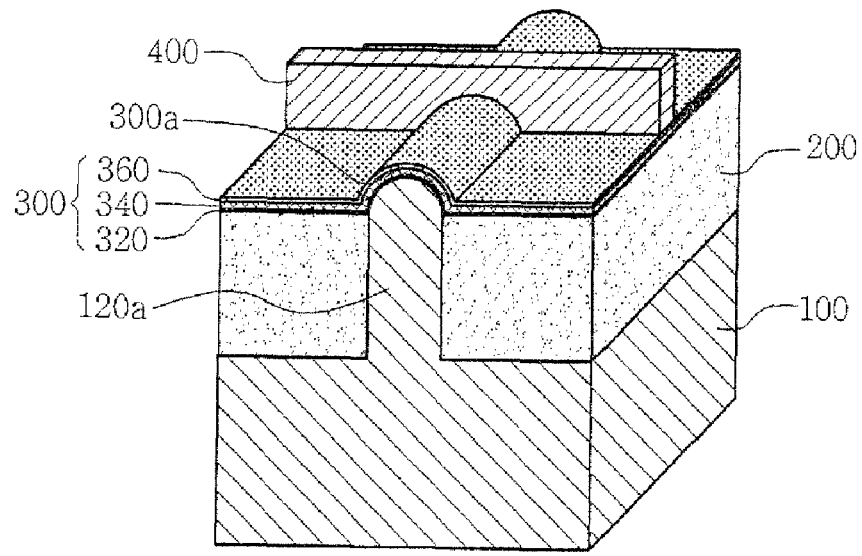

Therefore, one embodiment is a SONOS memory device comprising a semiconductor substrate having an active region and a field region; a gate formed over the active region; multi-dielectric layers formed between the active region and the gate, wherein the multi-dielectric layers are comprised of a first oxide layer, a nitride layer and a second oxide layer sequentially formed on the active region; and a source region and a drain region formed in the active region under both sides of the gate respectively, wherein the upper surface of the active region is a cylindrical type (the cross section is hemisphere), as shown in FIG. 11b, the multi-dielectric layers also has a cylindrical shape, and the gate wraps the second oxide layer in the cylindrical shape of the multi-dielectric layers, as shown in FIG. 11c.

Figure 7:
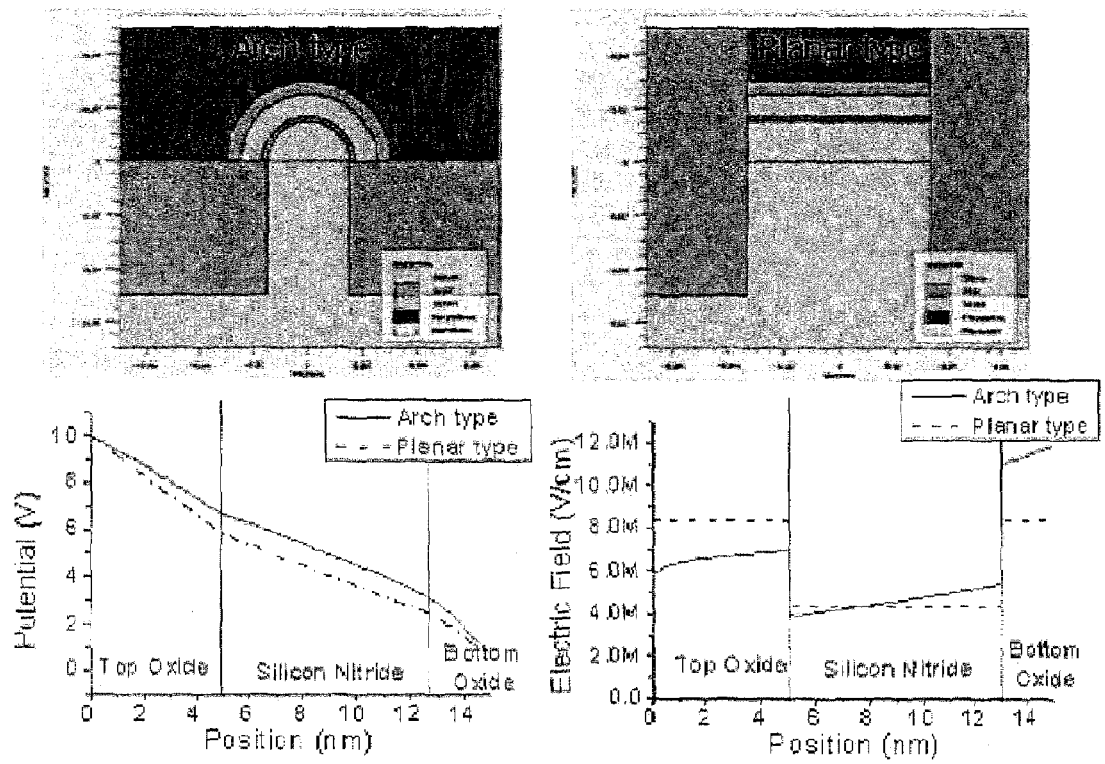
FIG. 7 is a graph comparing the voltage and the electric field at multi-dielectric layers according to some embodiments having a curved surface with those of a conventional planar SONOS device.
Figure 8:
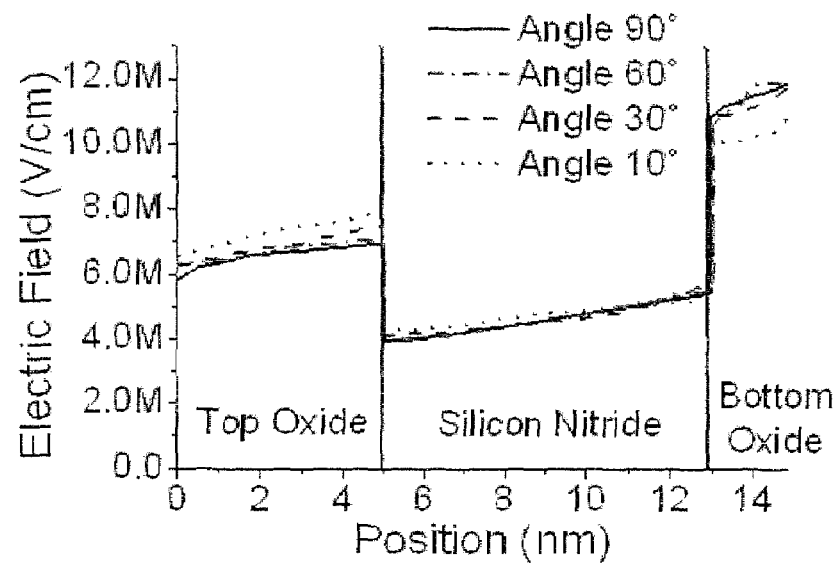
FIG. 8 is a comparative graph of the electric field distribution from each cross section at different angles on the curved surface of some embodiments.

To compare the characteristic of an electric field of the cylindrical (Arch) SONOS device of the present invention with that of a conventional planar SONOS device, we have conducted simulation by applying a specific voltage (10V) to each gate. From the simulation results, we have found that electric field at a tunneling oxide (Bottom Oxide) of the new structure (Arch type) is much larger than that of a conventional structure (Planar type) and electric field at a blocking oxide (Top Oxide) of the new structure (Arch type) is much smaller than that of a conventional structure (Planar type), as shown in FIG. 7. Also, we have found that there is no difference in electric field at each cross section according to various angles within the same cylindrical structure, as shown in FIG. 8.

Figure 9:
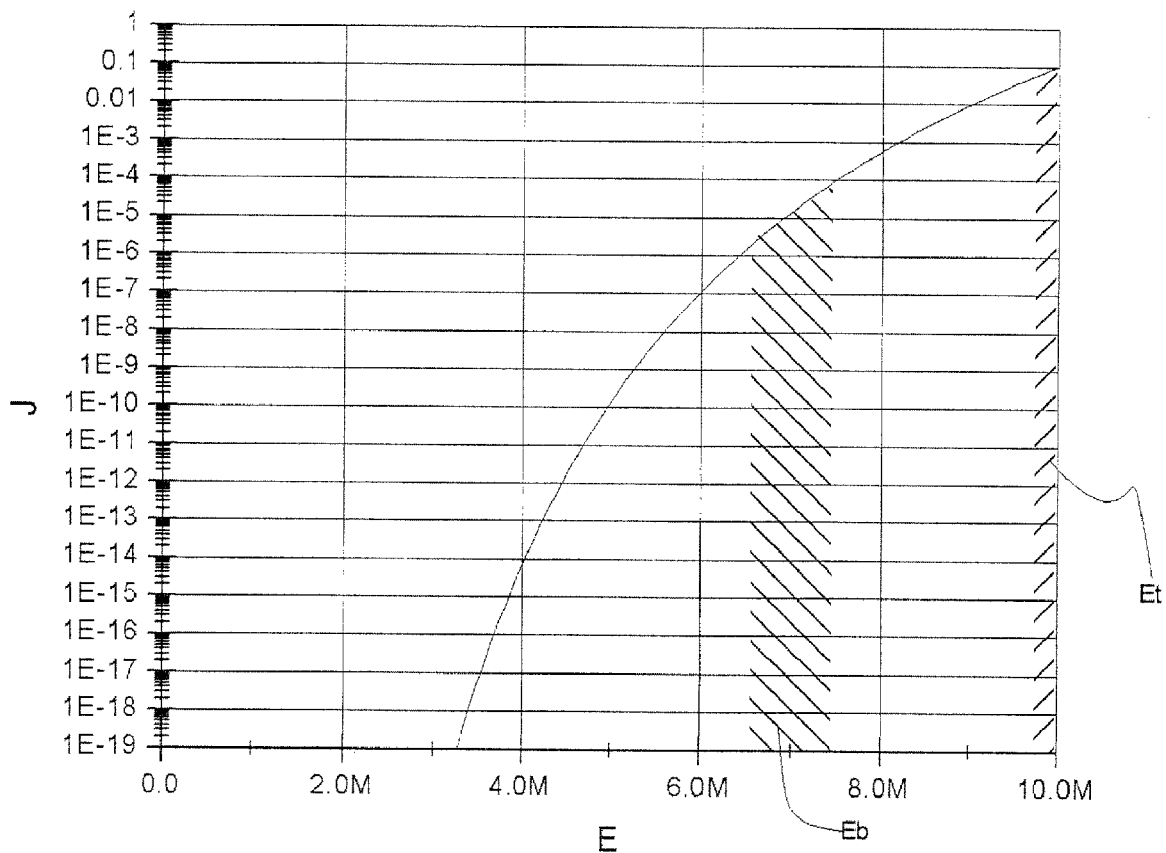
FIG. 9 is a graph of the electrical characteristics, which illustrate F-N tunneling current dependent on the electric field.

After all, the magnitude of the electric field is dependent on the radius only under the same dielectric material condition. Therefore, when the radius of curvature of the blocking oxide (Top Oxide) is designed to be larger than that of the tunneling oxide (Bottom Oxide), the magnitude of the electric field Eb at the blocking oxide (Top Oxide) becomes smaller than that of the electric field Et at the tunneling oxide (Bottom Oxide), and it is possible to reduce electrons that penetrate the blocking oxide (Top Oxide) and back-tunnel to a nitride layer of multi-dielectric layers on erasing, as shown in FIG. 9, which illustrates Equation 4.

Figure 10:
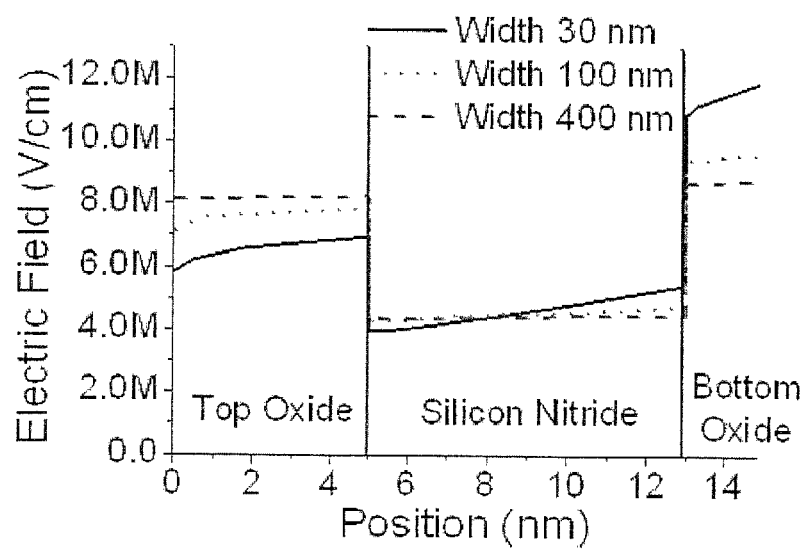
FIG. 10 is a graph of the electric field distribution that illustrates the effect of a radius of curvature of a cylindrical (arch) surface over a silicon active region on the electric field of multi-dielectric layers (ONO layers).

To investigate further, we have conducted simulation of the effect of a radius of curvature of the upper cylindrical curved surface of the silicon active region, that is, the width of a channel on the electric field strength at the tunneling oxide (Bottom Oxide) and the blocking oxide (Top Oxide). As shown in FIG. 10, the results show that the larger a radius of curvature of the upper cylindrical curved surface of the silicon active region is, the smaller the difference between electric field strength at the tunneling oxide (Bottom Oxide) and at the blocking oxide (Top Oxide) becomes. Especially, to make the difference between F-N currents at the tunneling oxide (Bottom Oxide) and at the blocking oxide (Top Oxide) 100 times (2 order) or more, the radius of curvature of the upper cylindrical curved surface of the silicon active region should be at least 50 nm and below (that is, the width should be at least 100 nm and below).

Also, it is more preferable that the radius of curvature of the upper surface of the second oxide layer is twice or more than that of the upper surface of the active region.

Next, a detailed description of preferred embodiments of a method for fabricating a SONOS memory device is provided as follows:

As shown in FIGS. 11a to FIG. 11c, the first embodiment of the method for fabricating a SONOS memory device basically comprises: a first step of forming a mask for a predetermined active region by depositing an insulating layer on a semiconductor substrate 100 and etching the insulating layer; a second step of forming a fin-shape active region 120 by etching a substrate using the mask, and forming a field region 200 around the active region with an oxide layer; a third step (FIG. 11a) of planarizing the upper part of the active region and the field region, and etching the oxide layer of the field region in order to expose a part of the fin-shape active region; a fourth step (FIG. 11b) of an annealing process for making the exposed fin-shape part of the active region cylindrical; and a fifth step (FIG. 11c) of forming multi-dielectric layers (ONO layers) 300 by depositing a first oxide layer 320, a nitride layer 340 and a second oxide layer 360 sequentially on the cylindrical active region and the field region, and forming a control gate 400 by depositing a gate material on the multi-dielectric layers and etching the gate material.

For an insulating layer, an oxide layer or a nitride layer is proper, however, whatever can play a role of a mask on etching silicon to make a fin-shape active region 120, such as PR (Photo Resist) can be an insulating layer. Etching a silicon substrate can use a STI (Shallow Trench Isolation) process. Forming a field region with an oxide layer, planarizing process, and so on follow a conventional CMOS process, and detailed descriptions of these are omitted here. To be sure, the first oxide layer 320 is a tunneling oxide; the nitride layer 340 is silicon nitride (for example, $Si_3N_4$); and the second oxide layer 360 is a blocking oxide.

Figure 12A:
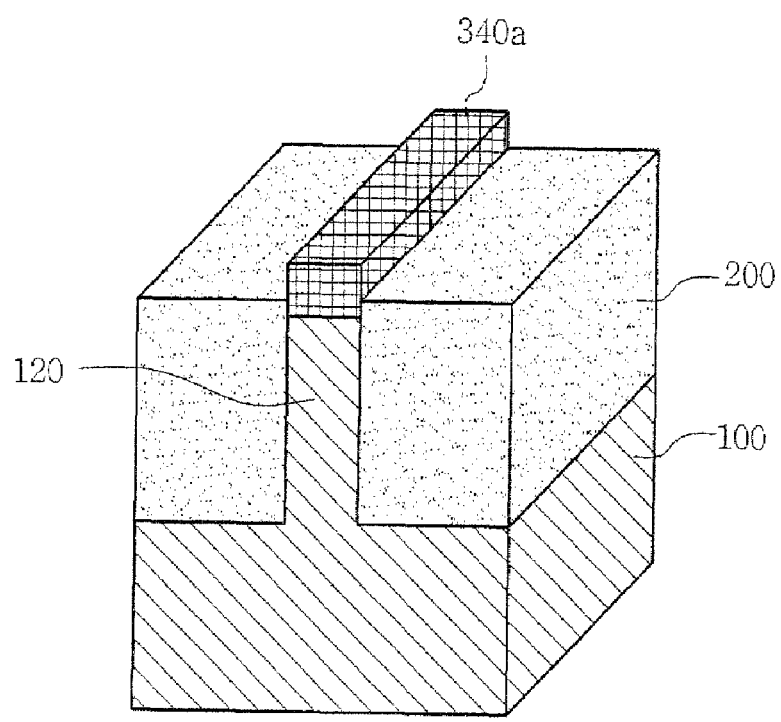
Figure 12B:
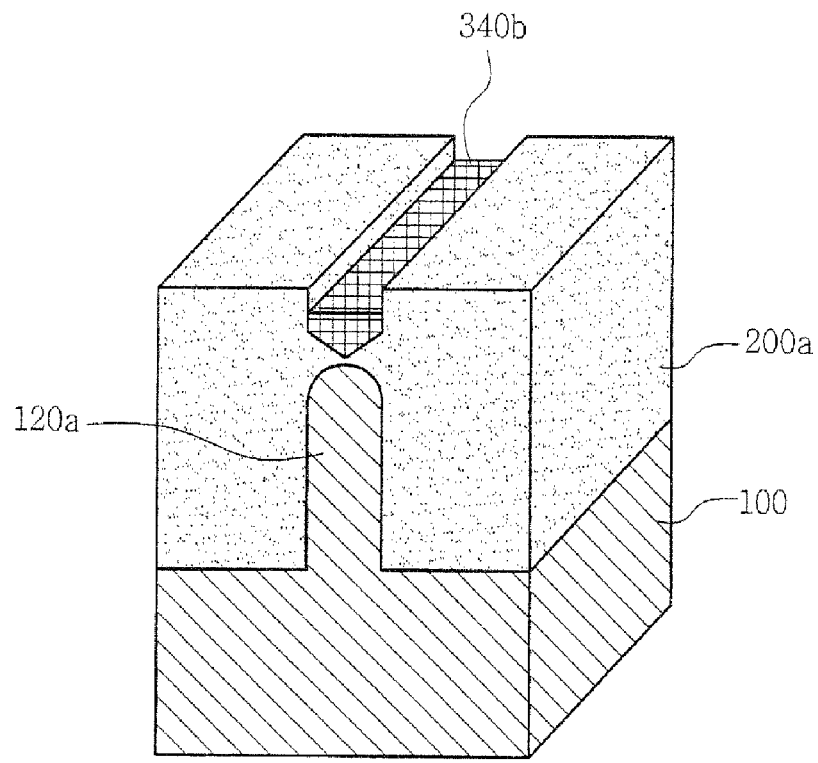
Figure 12C:
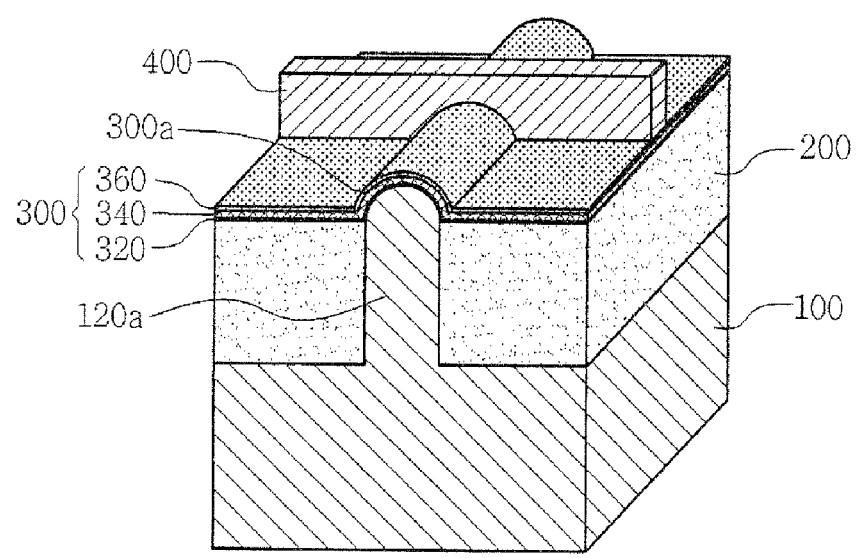

As shown in FIGS. 12a to 12c, the second embodiment of the method for fabricating a SONOS memory device may follow the first embodiment of the method, wherein at the first step, an insulating layer is a nitride layer (for example, $Si_3N_4$); at the third step, the planarizing process is accomplished by CMP (Chemical Mechanical Polishing) and etching a part of the oxide layer 200 of the field region in order to expose a part of the mask of the nitride layer 340a (FIG. 12a); and at the fourth step, annealing is replaced with an oxidation for making the upper shape of the active region cylindrical (FIG. 12b), etching the nitride layer 340b and a part of the oxide layer 200a of the field region to expose the upper cylindrical part 120a of the active region.

The nitride layer 340a plays a role as a etch stopper in CMP process, and an oxidation process for making the upper shape of the active region cylindrical may be a dry oxidation as well as a wet oxidation. Other processes follow a conventional CMOS process, and detailed descriptions of these are omitted here.

Figure 1:
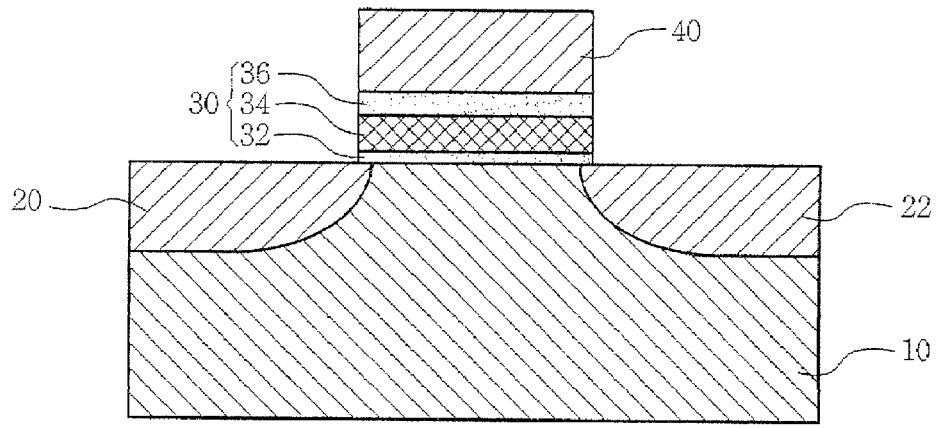
FIG. 1 is a cross-section of a conventional planar type SONOS device.
Figure 2:
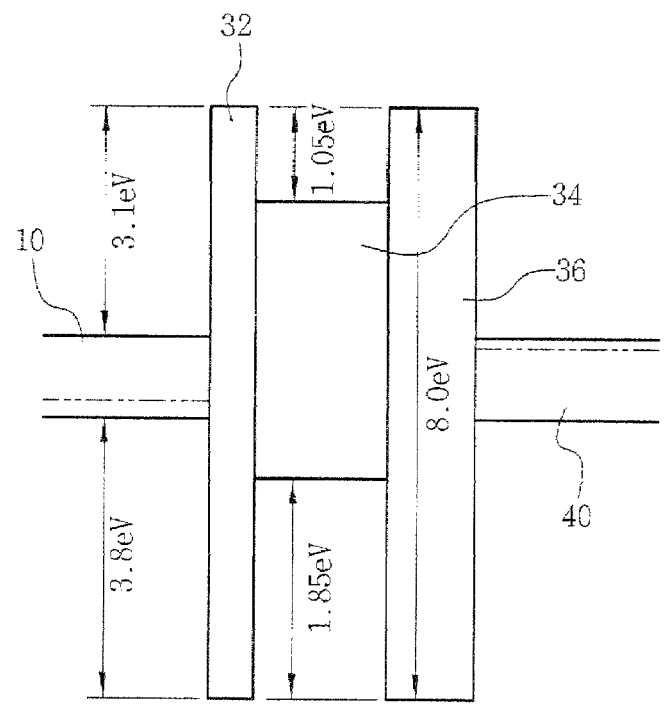
FIG. 2 is an energy band diagram when any voltage is not applied to the SONOS device of FIG. 1.
Figure 3:
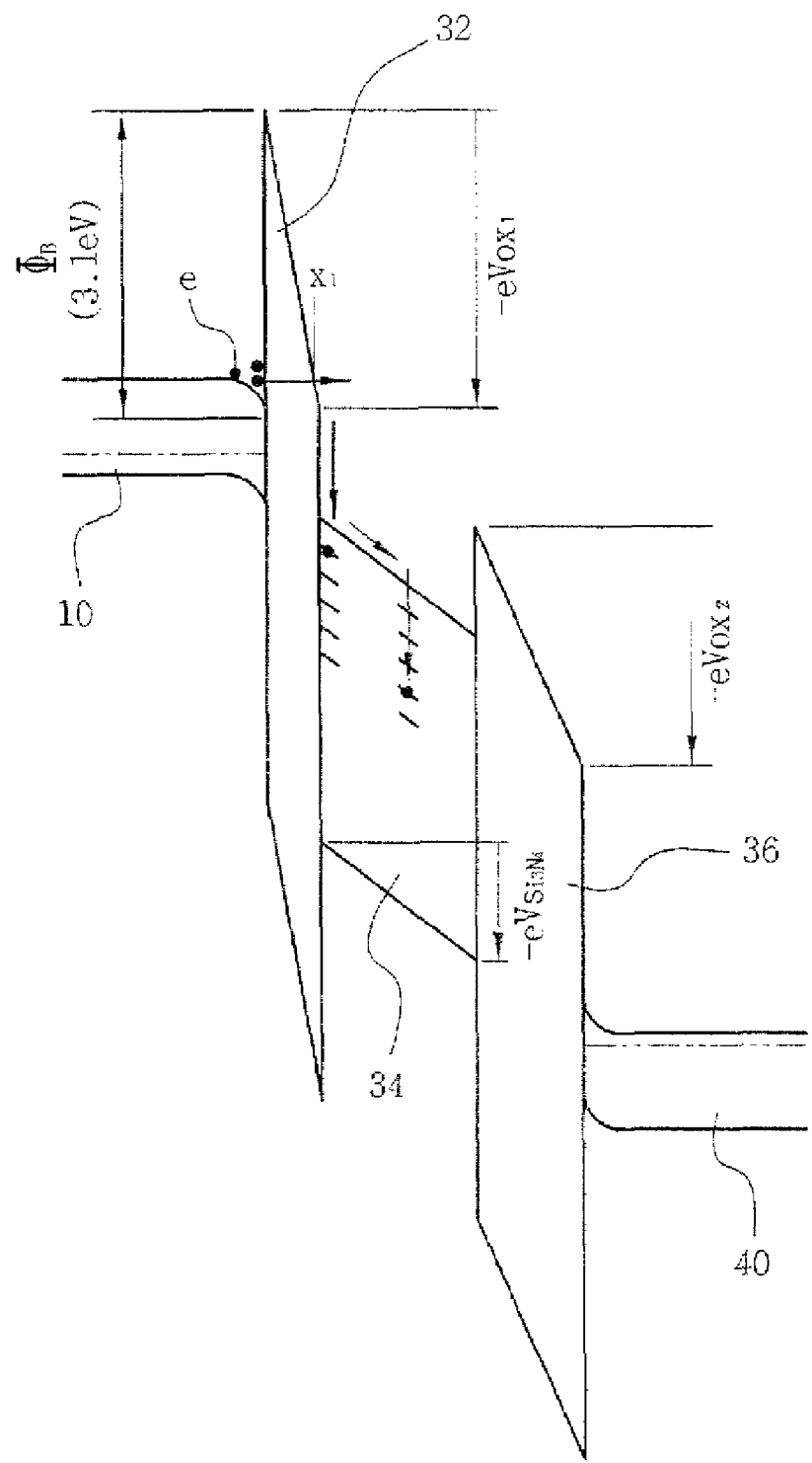
FIG. 3 is an energy band diagram when higher voltage is applied to a gate compared to a substrate for programming of the SONOS device of FIG. 1.
Figure 4:
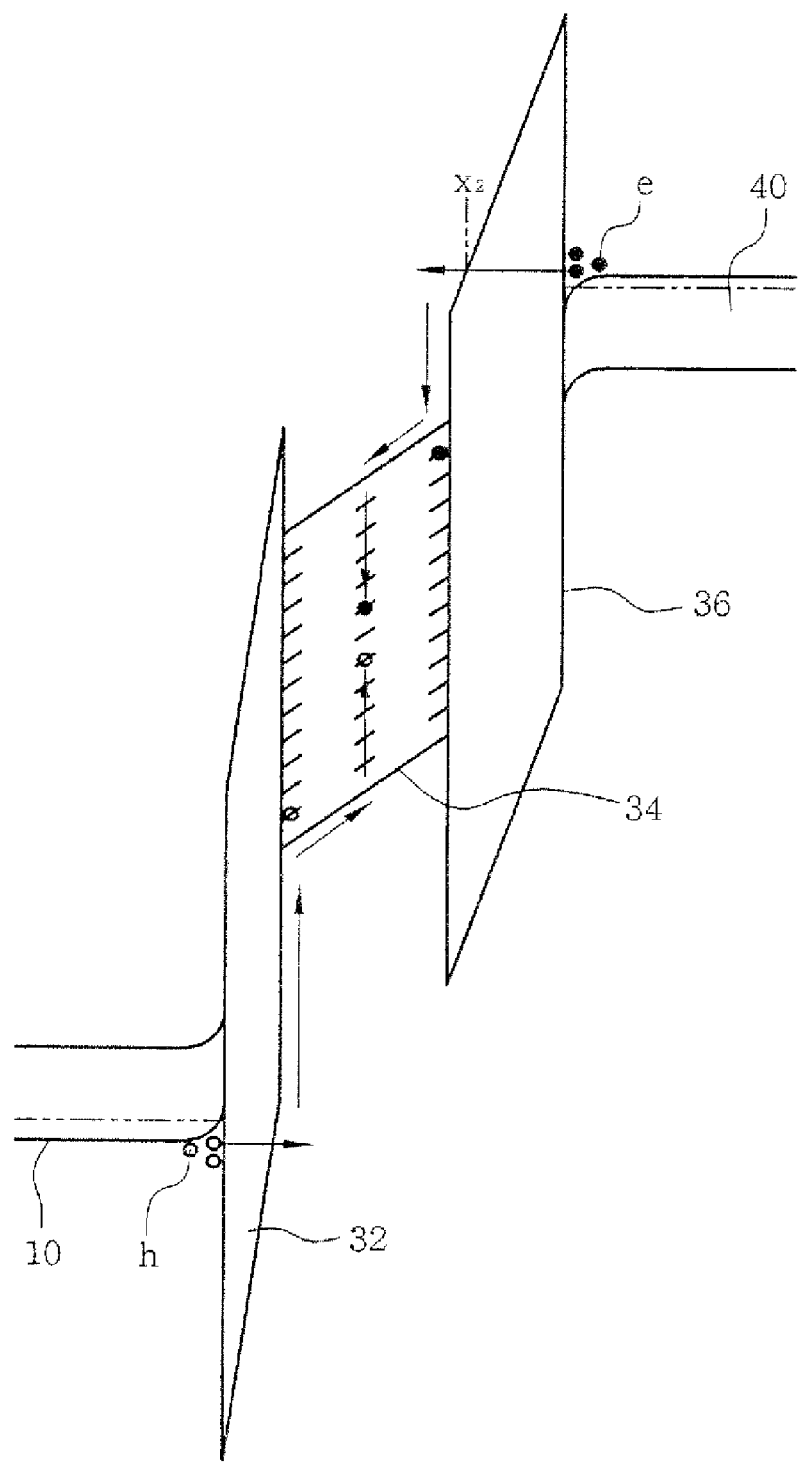
FIG. 4 is an energy band diagram that shows a back-tunneling of electrons when lower voltage is applied to a gate compared to a substrate for erasing of the SONOS device of FIG. 1.
Figure 5:
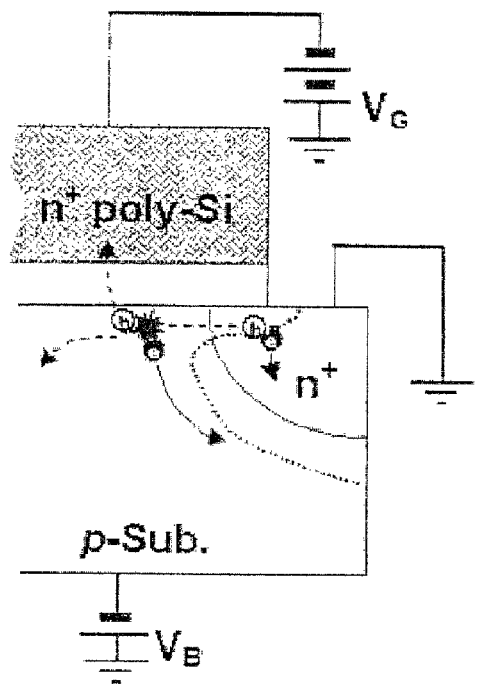
FIG. 5 is a diagram illustrating an erase by injecting hot holes induced by a gate.
Figure 13A:
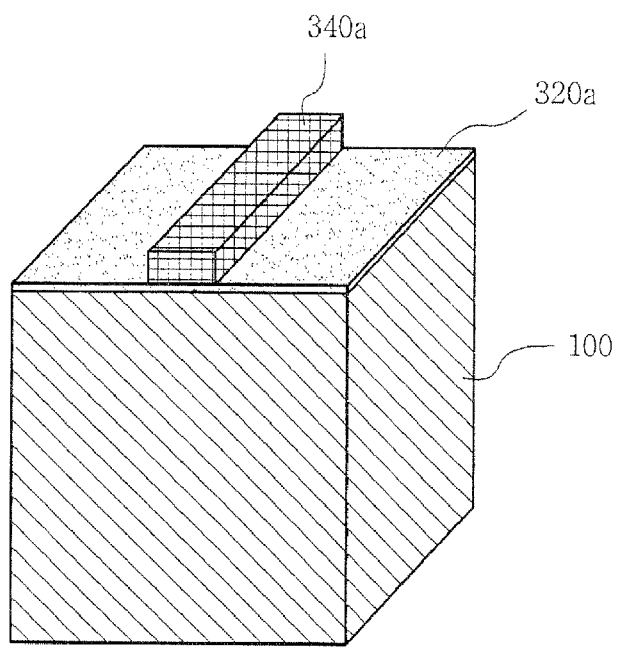
Figure 13B:
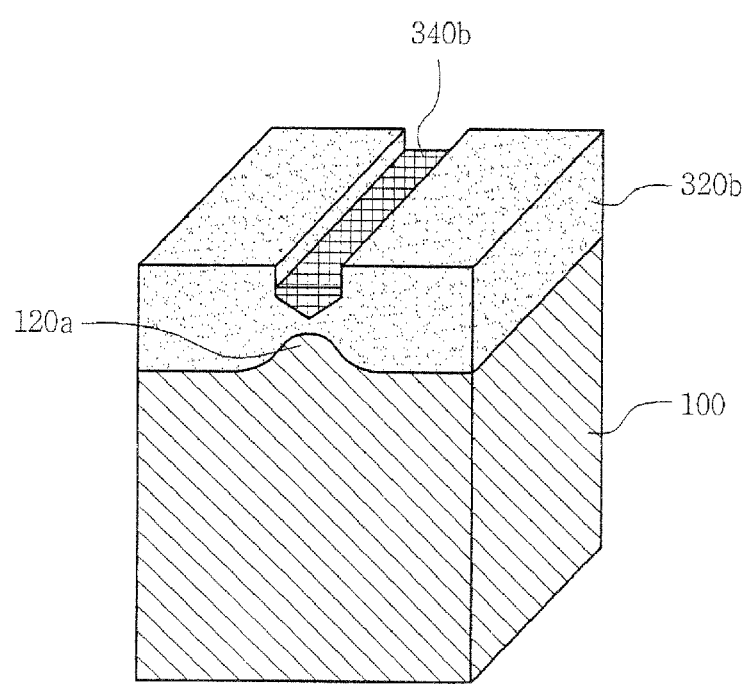
Figure 13C:
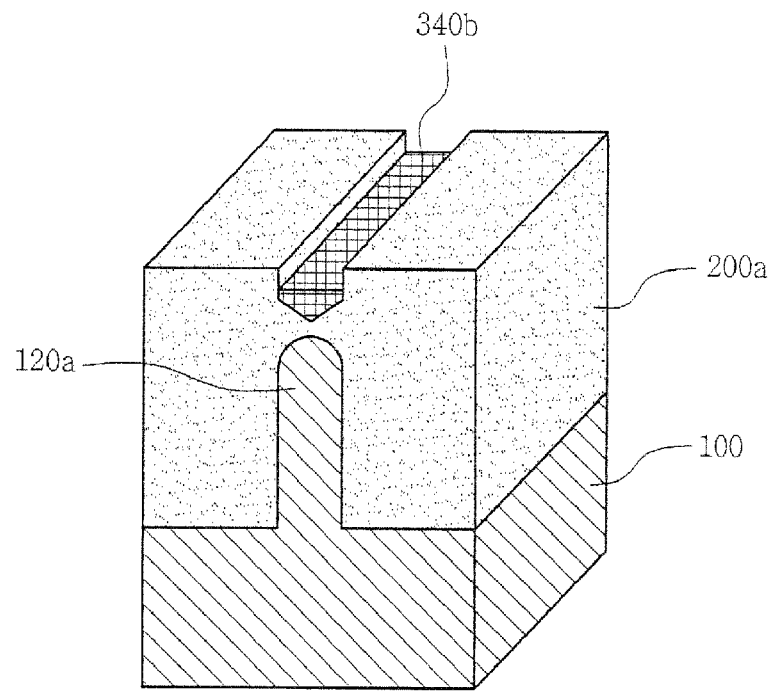

As shown in FIGS. 13a to 13c, the third embodiment of the method for fabricating a SONOS memory device may follow the first embodiment of the method, wherein at the first step, forming an oxide layer 320a thinly on the semiconductor substrate is achieved first, before depositing the insulating layer, and depositing an insulating layer is depositing nitride layer 340a on the oxide layer (FIG. 13a); at the second step, forming a fin-shape active region is achieved by an oxidation (FIG. 3b), etching the substrate by the mask to make a fin-shape active region 120a, and forming a field region 200a around the active region by filling an oxide layer up with gap fill (FIG. 13c); at the third step, planarizing process is accomplished by CMP; and at the fourth step, annealing is replaced with the oxidation of the second step. Processes here also follow a conventional CMOS process, and detailed descriptions of these are omitted here.

Figure 14A:
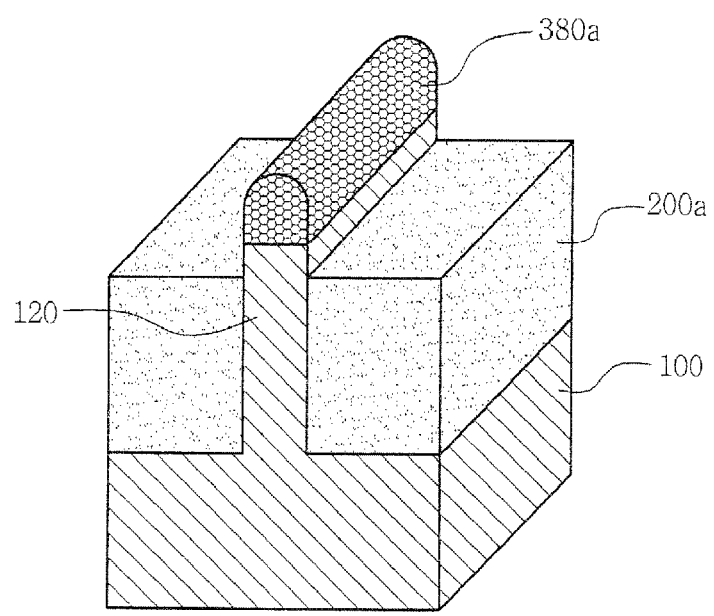
Figure 14B:
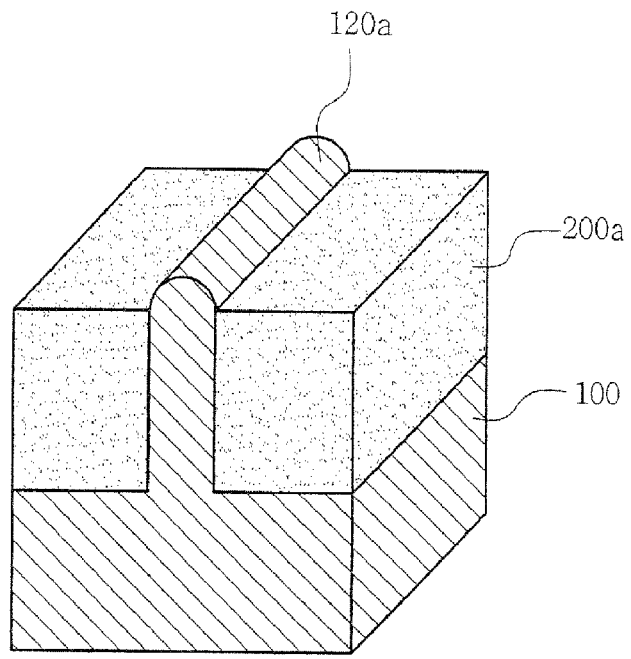
Figure 15A:
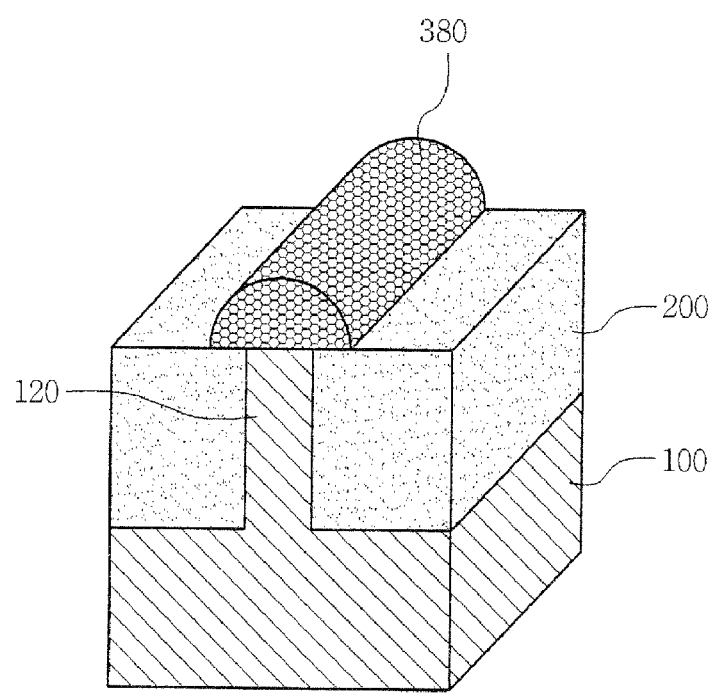

As shown in FIGS. 14a to 15a, the fourth embodiment of the method for fabricating a SONOS memory device may follow the first embodiment of the method, wherein at the third step, the planarizing process is accomplished by CMP, and before etching a part of the oxide layer 200 of the field region after the planarizing process, forming a hard mask 380 on the active region 120 is performed (FIG. 15a), and etching the hard mask 380 and a part of the oxide layer 200 of the field region in FIG. 15a to expose the fin-shape 120 of the active region like FIG. 14a is performed; and at the fourth step, before the annealing, removing the hard mask 380a is performed.

The selectivity of the hard mask 380 with silicon should be poor, and a cylindrical hard mask like FIG. 15a can be obtained from ashing photo-resist or from using a sidewall patterning technique with poly-silicon. Processes here also follow a conventional CMOS process, and detailed descriptions of these are omitted here.

Figure 15B:
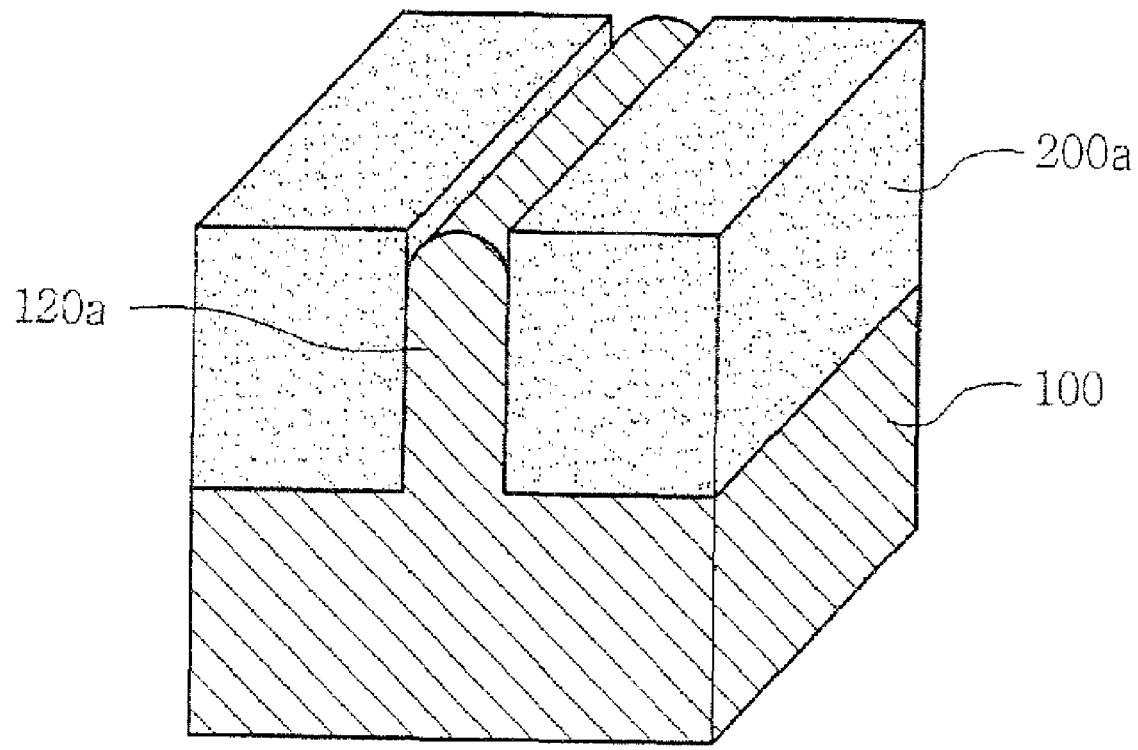

As shown in FIGS. 15a to 15b, the fifth embodiment of the method for fabricating a SONOS memory device may follow the fourth embodiment of the method, wherein at the third step, etching the hard mask 380 and a part of the oxide layer 200 of the field region is isotropic so that there is no projection of the fin-shape of the active region; and at the fourth step, annealing and removing of the hard mask can be replaced with etching a part of the oxide layer 200a of the field region.

Here, the selectivity of the hard mask 380 with silicon should be poor, and the step of etching the hard mask and a part of the oxide layer of the field region should be by an isotropic etching. An isotropic etching process and others here follow a conventional CMOS process, and detailed descriptions of these are omitted here.

In order to perform ion doping for forming a source and a drain, from the first to the fifth embodiments, the another step, comprising of forming a mask pattern having the same width as the length of a channel by depositing an insulating layer on the semiconductor substrate and etching the insulating layer; and performing ion doping for forming a source and a drain, can be added to before the first step.

Or, the ion doping for forming a source and a drain can be accomplished in the first to the fifth embodiments, wherein at the fifth step, etching for forming a control gate is etching a gate material deposited on the multi-dielectric layers as well as the multi-dielectric layers under the gate material to be etched, and implanting ions to the upper active region, the field region and the control gate, exposed by etching process of the fifth step. As a result, ion implantation into a source and a drain region as well as to the control gate of poly-silicon can be achieved at the same time.

It must be comprehended that the above preferred embodiments of a method for fabricating a SONOS memory device are exemplary only to help understand the embodiments and not to limit its interpretation. And various other embodiments with a conventional CMOS process may be devised from the spirit and novel principles of the invention. Therefore, all these various other embodiments belong to the objectives of the invention.

According to some embodiments, a conventional planar surface of multi-dielectric layers (ONO layers) of a SONOS device is changed with such a curved surface as a cylindrical type, and the radius of curvature of the upper surface of a blocking oxide can be designed to be larger than that of the lower surface of a tunneling oxide, and it restricts electrons from passing through the blocking oxide by back-tunneling on erasing. As a result, a SONOS memory device according to some embodiments shows an improvement in erasing speed.

What is claimed is:

1. A SONOS memory device comprising:
 a semiconductor substrate having an active region and a field region;
 a gate formed over the active region;
 a multi-dielectric layer formed between the active region and the gate, wherein the multi-dielectric layer is comprised of a first oxide layer, a nitride layer and a second oxide layer from the active region; and
 a source region and a drain region formed in the active region under both sides of the gate respectively,
 wherein the upper surface of the active region is a curved surface,
 wherein the multi-dielectric layers also have a curved shape according to the upper surface of the active region,
 wherein the gate wraps the second oxide layer having the curved shape, and wherein the radius of curvature of the second oxide layer is larger than that of the upper surface of the active region to make a difference between F-N currents at the first oxide layer and at the second oxide layer.

2. The SONOS memory device of claim 1, wherein the curved surface of the active region is a cylindrical surface.

3. The SONOS memory device of claim 1, wherein a radius of curvature of the upper surface of the active region is 50 nm and below.

4. The SONOS memory device of claim 2, wherein a radius of curvature of the upper surface of the active region is 50 nm and below.

5. The SONOS memory device of claim 1, wherein a radius of curvature of the upper surface of the second oxide layer is twice or more than that of the upper surface of the active region.

6. The SONOS memory device of claim 2, wherein a radius of curvature of the upper surface of the second oxide layer is at least twice that of the upper surface of the active region.

* * * * *